(12) United States Patent
Tan et al.

(10) Patent No.: US 9,117,810 B2
(45) Date of Patent: Aug. 25, 2015

(54) LEADLESS SEMICONDUCTOR PACKAGE AND METHOD OF MANUFACTURE

(71) Applicant: STMicroelectronics, Inc., Calamba (PH)

(72) Inventors: Jerry Tan, Calamba (PH); William Cabreros, Sta Rosa (PH)

(73) Assignee: STMicroelectronics, Inc., Calamba (PH)

( * ) Notice: Subject to any disclaimer, the term of this patent is extended or adjusted under 35 U.S.C. 154(b) by 0 days.

(21) Appl. No.: 14/478,799

(22) Filed: Sep. 5, 2014

(65) Prior Publication Data

US 2014/0377910 A1 Dec. 25, 2014

Related U.S. Application Data

(62) Division of application No. 12/982,743, filed on Dec. 30, 2010, now abandoned.

(51) Int. Cl.
| | | |
|---|---|---|
| H01L 21/00 | (2006.01) | |
| H01L 23/495 | (2006.01) | |
| H01L 21/48 | (2006.01) | |
| H01L 21/56 | (2006.01) | |
| H01L 23/31 | (2006.01) | |
| H01L 23/00 | (2006.01) | |

(52) U.S. Cl.
CPC ...... *H01L 23/49575* (2013.01); *H01L 21/4828* (2013.01); *H01L 21/561* (2013.01); *H01L 23/3107* (2013.01); *H01L 23/49503* (2013.01); *H01L 23/49541* (2013.01); *H01L 23/49582* (2013.01); *H01L 24/97* (2013.01); *H01L 24/45* (2013.01); *H01L 24/48* (2013.01); *H01L 24/49* (2013.01); *H01L 2224/32245* (2013.01); *H01L 2224/45144* (2013.01); *H01L 2224/48091* (2013.01); *H01L 2224/48245* (2013.01); *H01L 2224/48247* (2013.01); *H01L 2224/48471* (2013.01); *H01L 2224/49052* (2013.01); *H01L 2224/49171* (2013.01); *H01L 2224/73265* (2013.01); *H01L 2224/97* (2013.01); *H01L 2924/00013* (2013.01); *H01L 2924/01028* (2013.01); *H01L 2924/01029* (2013.01); *H01L 2924/01033* (2013.01); *H01L 2924/01079* (2013.01); *H01L 2924/01082* (2013.01); *Y10T 29/49121* (2015.01)

(58) Field of Classification Search
USPC ......... 257/670, 676, 684, 690, 692, 738, 787; 438/108, 110, 111, 106
See application file for complete search history.

(56) References Cited

U.S. PATENT DOCUMENTS

| | | |
|---|---|---|
| 6,238,952 B1 | 5/2001 | Lin |
| 6,740,961 B1 * | 5/2004 | Mostafazadeh ............... 257/676 |
| 7,226,811 B1 | 6/2007 | McLellan et al. |

(Continued)

*Primary Examiner* — Errol Fernandes
(74) *Attorney, Agent, or Firm* — Seed IP Law Group PLLC

(57) ABSTRACT

A leadless semiconductor package includes a package body on a leadframe that includes a die paddle and a plurality of bond pads, none of which extend as far as a lateral face of the body. During manufacture of the package, molding compound is deposited over a face of the leadframe on which the die paddle and bond pads are positioned. After the molding compound is cured, a back side of the leadframe is etched to isolate the die paddle and bond pads, back surfaces of which remain exposed at a back face of the body. During manufacture of the leadframe, a parent substrate is etched to define the die paddle and a plurality of bond pads on one side of the substrate and a plurality of cavities on the opposite face.

20 Claims, 13 Drawing Sheets

(56) References Cited

U.S. PATENT DOCUMENTS

| | | |
|---|---|---|
| 7,829,984 B2 | 11/2010 | Do et al. |
| 8,063,470 B1 | 11/2011 | Sirinorakul et al. |
| 8,362,598 B2 | 1/2013 | Park et al. |
| 8,426,254 B2 | 4/2013 | Tan et al. |
| 2004/0063252 A1 | 4/2004 | Takahashi |
| 2008/0211068 A1 | 9/2008 | Chen et al. |
| 2009/0026594 A1 | 1/2009 | Yee et al. |
| 2010/0171201 A1 | 7/2010 | Wyant et al. |
| 2010/0258920 A1 | 10/2010 | Chien et al. |
| 2012/0025357 A1 | 2/2012 | Li |
| 2012/0091569 A1 | 4/2012 | Appelt et al. |
| 2012/0168920 A1 | 7/2012 | Tan et al. |

* cited by examiner

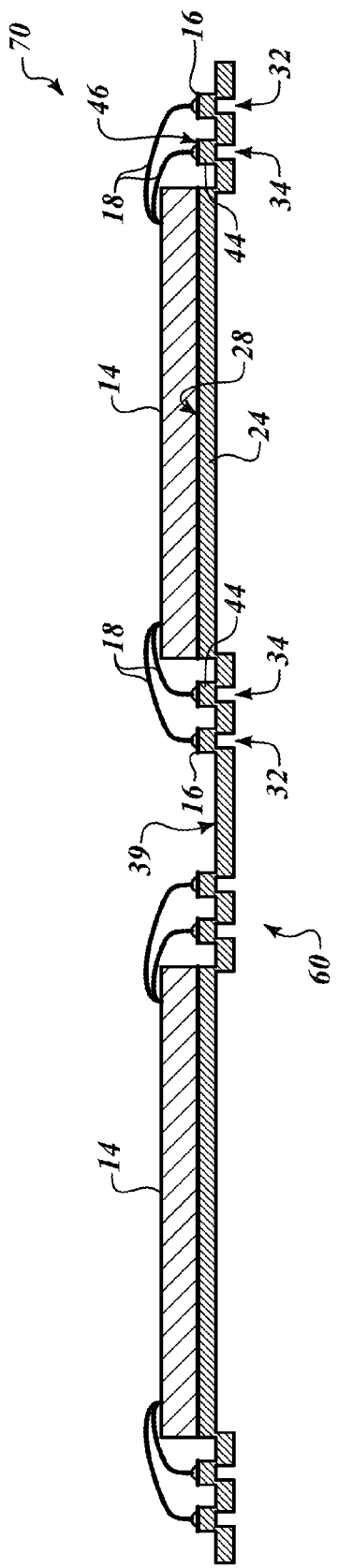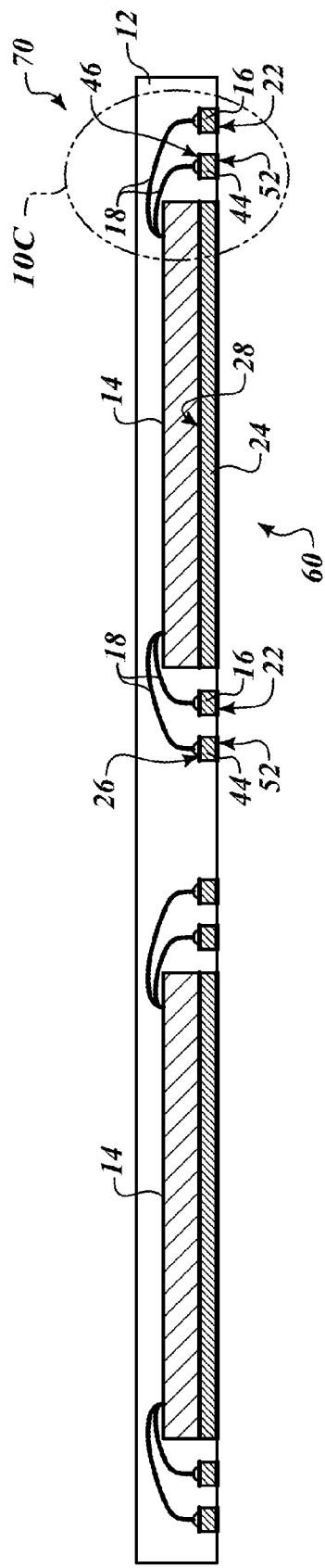

LEADLESS SEMICONDUCTOR PACKAGE AND METHOD OF MANUFACTURE

BACKGROUND OF THE INVENTION

1. Technical Field

The present disclosure relates to semiconductor packaging, and in particular to leadframe-based packages, to leadframes employed in such packages, and most particularly to flat, leadless type packages and leadframes, such as, e.g., QFN packages.

2. Description of the Related Art

While significant advances have been made in semiconductor packaging, including the development of a very large number of packaging types, the majority of semiconductor devices still employ leadframe based packages. This is due to a number of reasons. In particular, leadframe packages are relatively inexpensive to produce, are well known and understood, the tooling is already in hand or readily available, etc. Additionally, leadframe packages have some advantages over many other packages, including having better thermal transmission characteristics, and more being more robust. As industry demand moves toward smaller packages and higher contact density, leadframe technology continues to evolve, so that even within the general category of leadframe packages, there are many different types. However, leadframe-based packages have at least one element in common: they all have a leadframe. Leadframes are usually stamped or chemically milled from thin metal strips, which are generally formed in rolls. Typically, a leadframe includes a die paddle on which a semiconductor die is mounted, and a plurality of contact pads that are placed in electrical contact with respective bond pads of the leadframe.

Leadframes are machined from a roll, i.e., strip, of metal foil, usually copper, which can be plated to prevent oxidation that might otherwise interfere with making good electrical contact. Chemical milling is typically used to form leadframes that have very fine details, such as with near chip-scale frames and frames that employ a large number of leads.

FIG. 1 is a plan view of a portion of an exemplary leadframe strip 100 for a quad flat no-lead (QFN) semiconductor package. The strip 100 of FIG. 1 includes a plurality of die paddles 102, and a plurality of leads 104 associated with each die paddle. Support stringers 106 extend between a support frame 108 and the die paddles 102, and the bond pads are attached directly to the frame. During the packaging process a semiconductor material die is attached to the die paddle 102, usually via a thermally conductive adhesive. Bond wires are attached at one end to contact pads of the semiconductor die, and to respective ones of the leads 104 at the other end, thereby placing the leads in electrical contact with the contact pads of the semiconductor die. Prior to attaching the semiconductor dies, a carrier tape is adhered to the back side of the leadframe strip 100, and after the wire bonding step, a molding compound is applied over the semiconductor die and bonding wires to form a protective package body, the approximate dimensions of which are indicated by the dashed lines 110 of FIG. 1. The carrier tape prevents the molding compound from covering the back side of the leadframe, so that the back sides of the die paddles 102 and leads 104 are exposed for contact with a circuit board. After the molding compound has been cured, the carrier tape is removed and the packages are punched from the leadframe strip. In the punching process, portions of the leadframe that protrude from each package are trimmed very close to the face of the package. The exposed die paddle on the back side of each package permits a good thermal contact between the semiconductor die and a circuit board, while the exposed leads 104 enable mounting of the package to contacts on the circuit board that are positioned inside the footprint of the package, which reduces the surface area occupied by the package on the circuit board.

There is continual industry pressure to reduce the thickness of semiconductor packages, especially for use in consumer electronic devices such as cell phones and PDA devices. In some cases, OEM manufacturers require that a package height be no more than 400 µm, and it is likely that even thinner packages will be required in the future. One problem associated with leadframe-based packages is that there is a minimum thickness requirement for leadframe material. Typically, leadframe strips cannot be much less than about 100 µm, because thinner material becomes virtually impossible to handle without damage. It lacks the strength and rigidity to withstand normal handling and the processes to which it is subjected during typical manufacturing operations. To the extent that special tooling and procedures could be devised to successfully handle thinner material, this would represent a significant additional expense and would eliminate one of the primary advantages of leadframes over other packaging formats, i.e., the ability of many existing automated systems to perform some or all of the processing steps required for more advanced package designs.

FIG. 2 is a simple diagrammatic side view of a portion of a leadframe strip 120 according to known art. A carrier strip 122 is provided, on which separate die paddles 124 and leads 126 are formed by a metal deposition process. The carrier strip acts as a support substrate so that the die paddles and bond pads can be made much thinner than the nominal 100 µm limit of the traditional punched or chemically milled leadframe strips. Additionally, because the elements of the leadframe are individually formed, there is no requirement for a support frame, which permits greater freedom to the designer because there is no requirement that every feature have an unobstructed path to the perimeter. Furthermore, because the features are not required to be self-supporting, elements that are very thin or closely spaced can be formed, where similar elements on a traditional leadframe would bend or short against other elements. Unfortunately, the processes necessary to manufacture leadframes by metal deposition are expensive and time consuming.

BRIEF SUMMARY

According to one embodiment, a leadless semiconductor package is provided, including a package body on a leadframe that includes a die paddle and a plurality of bond pads, all of which have a back surface exposed at the back side of the body, but none of which extend as far as a lateral face of the body. The die paddle and bond pads can be plated, on their respective front faces and/or back faces, with a protective metal layer.

During manufacture of the package, molding compound is deposited over a front face of the leadframe on which the die paddle and bond pads are positioned. The face of the leadframe is substantially continuous and without perforations for at least the lateral dimensions of the body. After the molding compound is cured, a back side of the leadframe is etched to isolate the die paddle and bond pads, back surfaces of which remain exposed at a back face of the body after the etching.

During manufacture of the leadframe, a parent substrate is etched on a first face to define elements of the leadframe such as, e.g., the die paddle and the plurality of bond pads. The substrate is also etched on a second face, opposite the first face, to define a plurality of cavities on the second face, each positioned directly opposite a corresponding one of the elements on the first face, and each sized and shaped to substantially match the size and shape of the corresponding element. A protective metal layer is plated onto the surfaces of the elements of the lead frame and onto an inner wall of each of the cavities. The layer of metal plated onto the inner wall of each of the cavities acts as an etch stop to protect the corresponding element during the etch performed as part of the packaging process.

BRIEF DESCRIPTION OF THE SEVERAL VIEWS OF THE DRAWINGS

FIGS. 10A-10D are diagrams showing respective stages of the assembly of semiconductor packages according to one embodiment, using the leadframe strip described with reference to FIGS. 7-9C. FIGS. 10A, 10B and 10D are cross-sectional views of an assembly of semiconductor packages taken along a plane corresponding to the plane defined in FIG. 8 by lines 9A-9A, but extended through two leadframes. FIG. 10C is an enlarged view of a small portion of the assembly of FIG. 10B, as defined by the oval in FIG. 10B that is marked 10C.

DETAILED DESCRIPTION

Figure 3:
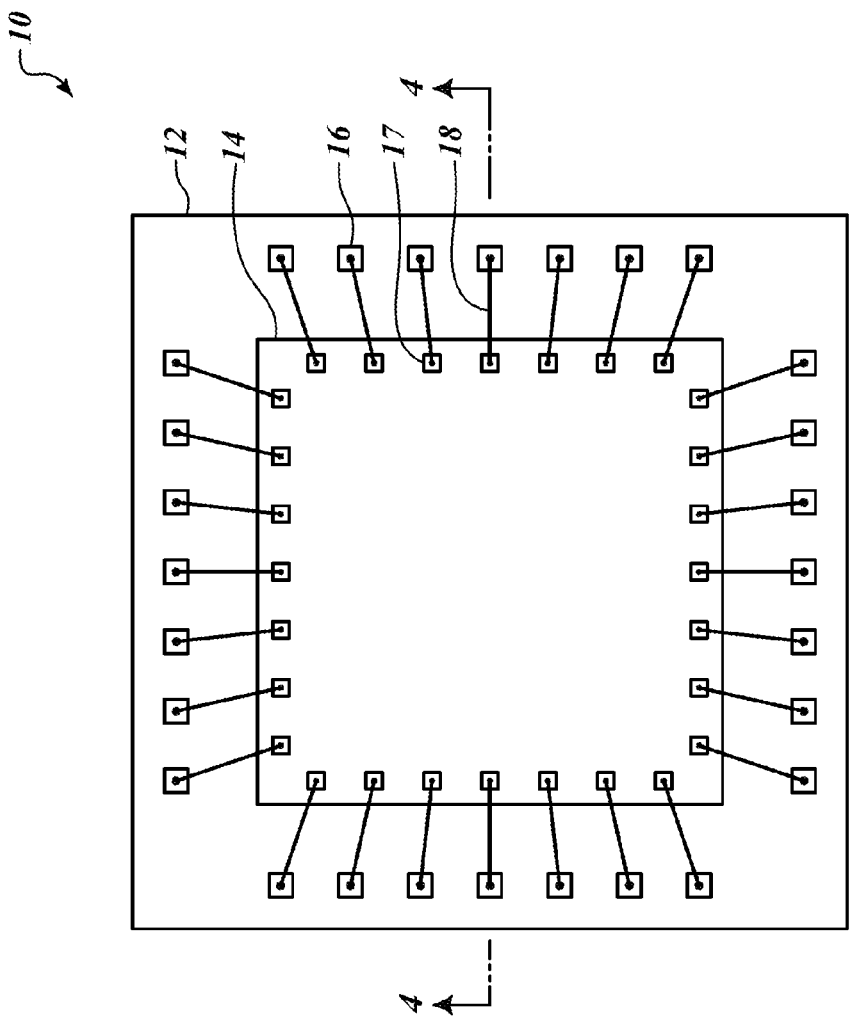
FIG. 3 is a plan view of a leadframe-based semiconductor package according to one embodiment.

Turning now to FIG. 3, a plan view is provided of a leadframe-based semiconductor package 10 according to an embodiment. The package 10 is encapsulated in a molding compound body 12 that is shown as though transparent in order to show the internal structure. The package 10 is in a quad flat pack, no lead (QFN) configuration, and includes a semiconductor die 14 with a plurality of contact pads 17, a plurality of bond pads 16, and a plurality of bond wires 18 coupled between respective pairs of the bond pads and the contact pads.

Figure 1:
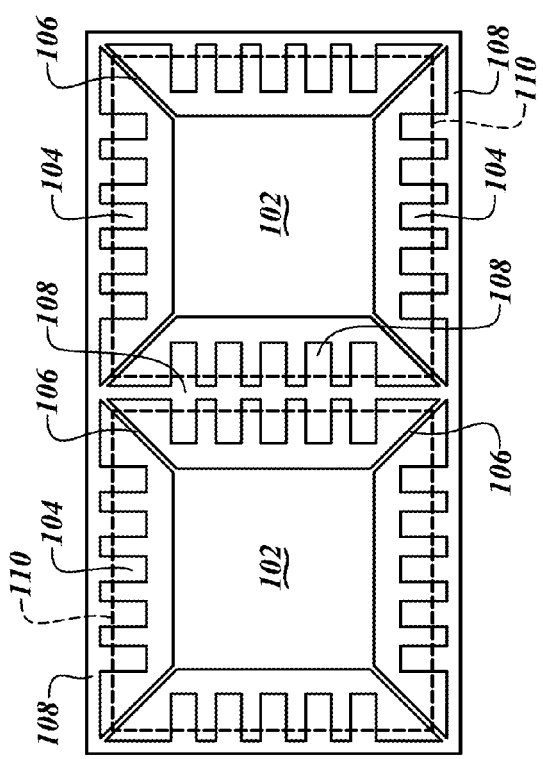
FIG. 1 is a plan view of a portion of an exemplary leadframe strip for a flat no-lead semiconductor package, according to known art.
Figure 4:
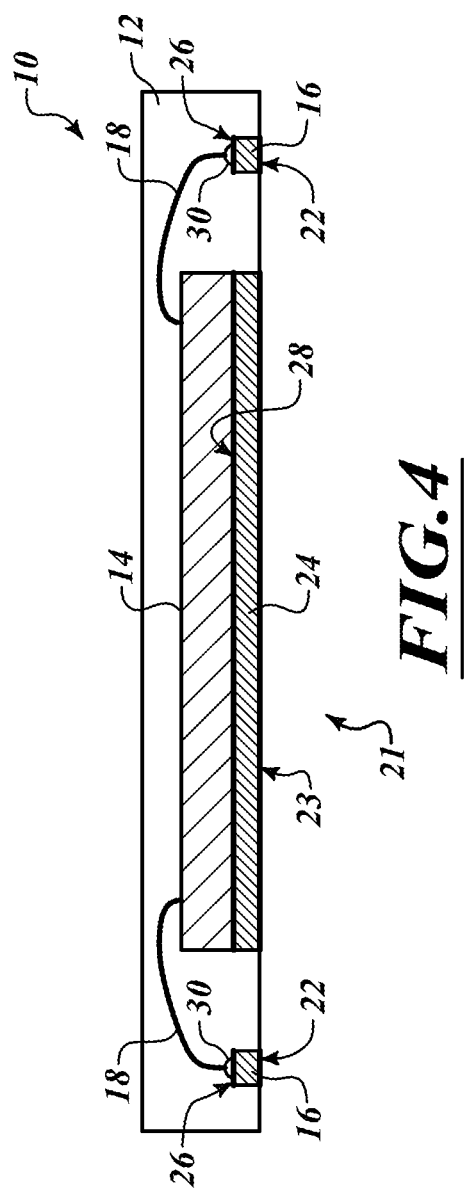
FIG. 4 is a cross-sectional view of the semiconductor package of FIG. 3 taken along lines 4-4 of FIG. 3.

FIG. 4 is a cross-sectional view of the semiconductor package 10 taken along lines 4-4 of FIG. 3. Portions of a leadframe 21 are visible, including a die paddle 24 on which the semiconductor die 14 is mounted, and also including a plurality of bond pads 16. The die paddle 24 and bond pads 26 are formed from a common sheet of metal, preferably copper or a copper alloy. An upper plating 26 and a lower plating 22 are positioned on each of the bond pads 16, while the die paddle 24 includes an upper plating 28 and a lower plating 23. As discussed with reference to the prior art devices of FIGS. 1 and 2, the leadframe elements, including the die paddle 24 and the bond pads 16, are exposed and electrically accessible at the back side of the package 10.

Figure 5:
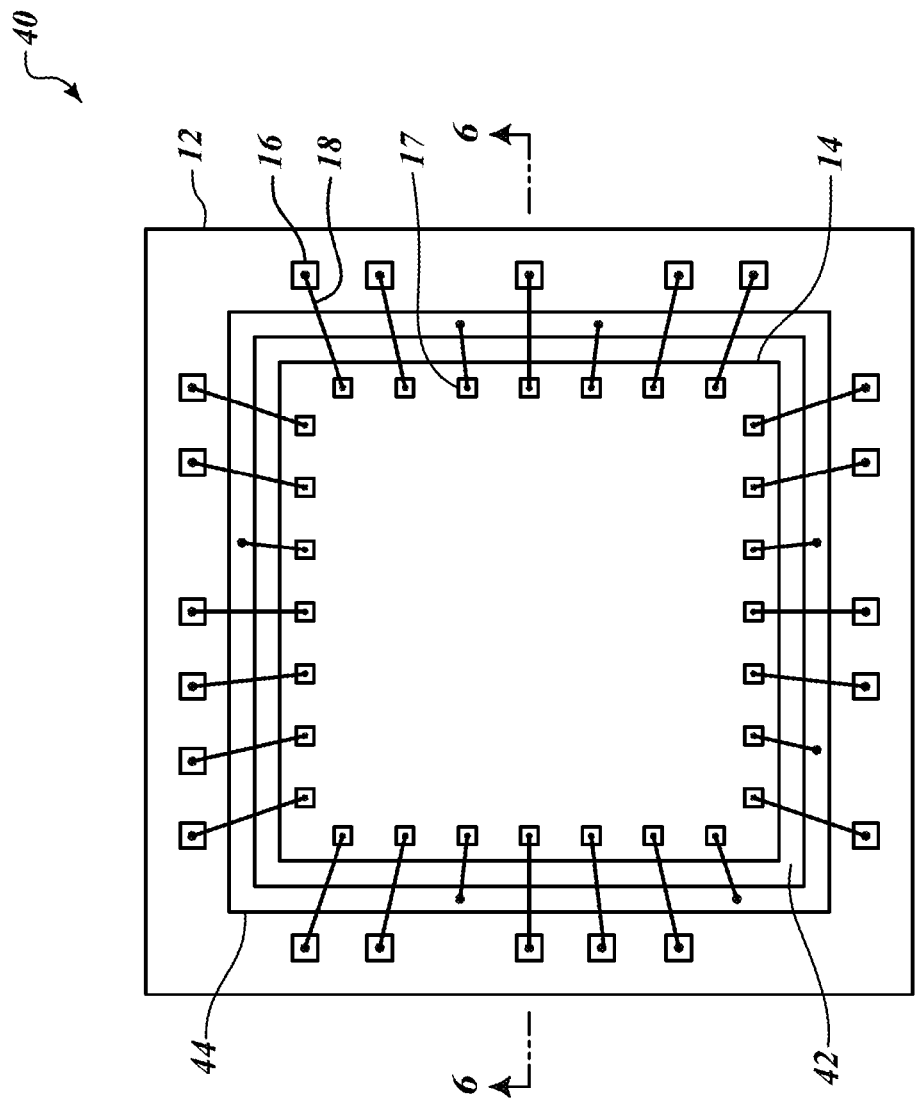
FIG. 5 is a plan view of a leadframe-based semiconductor package according to another embodiment.

FIG. 5 is a plan view of a leadframe-based semiconductor package 40 according to another embodiment. The package 40 is substantially similar to the package 10 described with reference to FIGS. 3 and 4, except that it also includes a contact ring 44 extending about the semiconductor device 14 and separated therefrom by a gap 42 which electrically isolates the contact ring from the device 14. The contact ring 44 may be provided, for example, where a number of the contact pads 17 on the semiconductor device 14 are required to be coupled to a common node, such as for a positive or negative power supply, or ground, etc., or where multiple contacts on an underlying circuit board are required to be coupled to such a common node. The package 40 includes a leadframe 41, partially shown in the cross-sectional view of FIG. 6, which also shows that the contact ring 44 includes an upper plating 46 and a lower plating 52.

It can be seen, with reference to FIG. 5, that the leadframe elements of the package 40 do not include features commonly associated with leadframe strips. For example, the die paddle 24 does not include support stringers, like those shown in the prior art device of FIG. 1, to support the die paddle as part of the leadframe strip until a package is formed around it. Furthermore, the die paddle 24 is completely surrounded by the contact ring 44, so it would be impossible to have provided support stringers extending from the die paddle to a support frame while keeping the support ring electrically isolated from the die paddle. Lastly, the bond pads 16 do not include portions extending to the perimeter of the package as would normally be the case.

Figure 6:
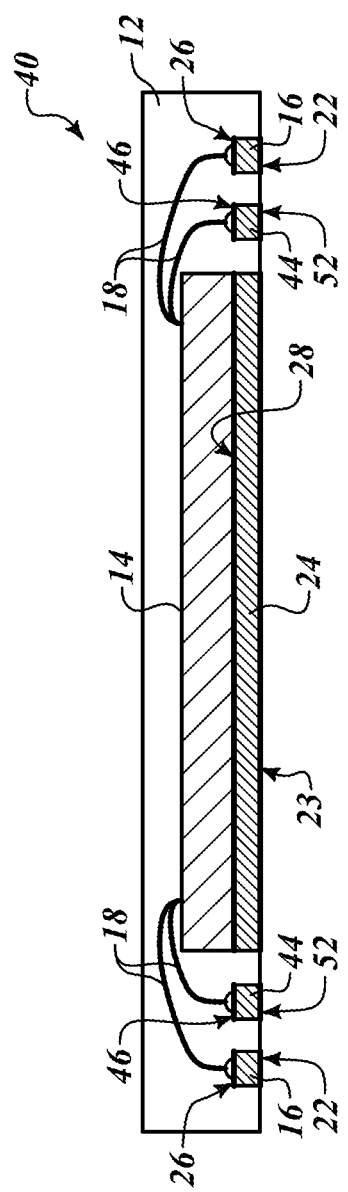
FIG. 6 is a cross-sectional view of the semiconductor package of FIG. 5, taken along lines 6-6 of FIG. 5.
Figure 7:
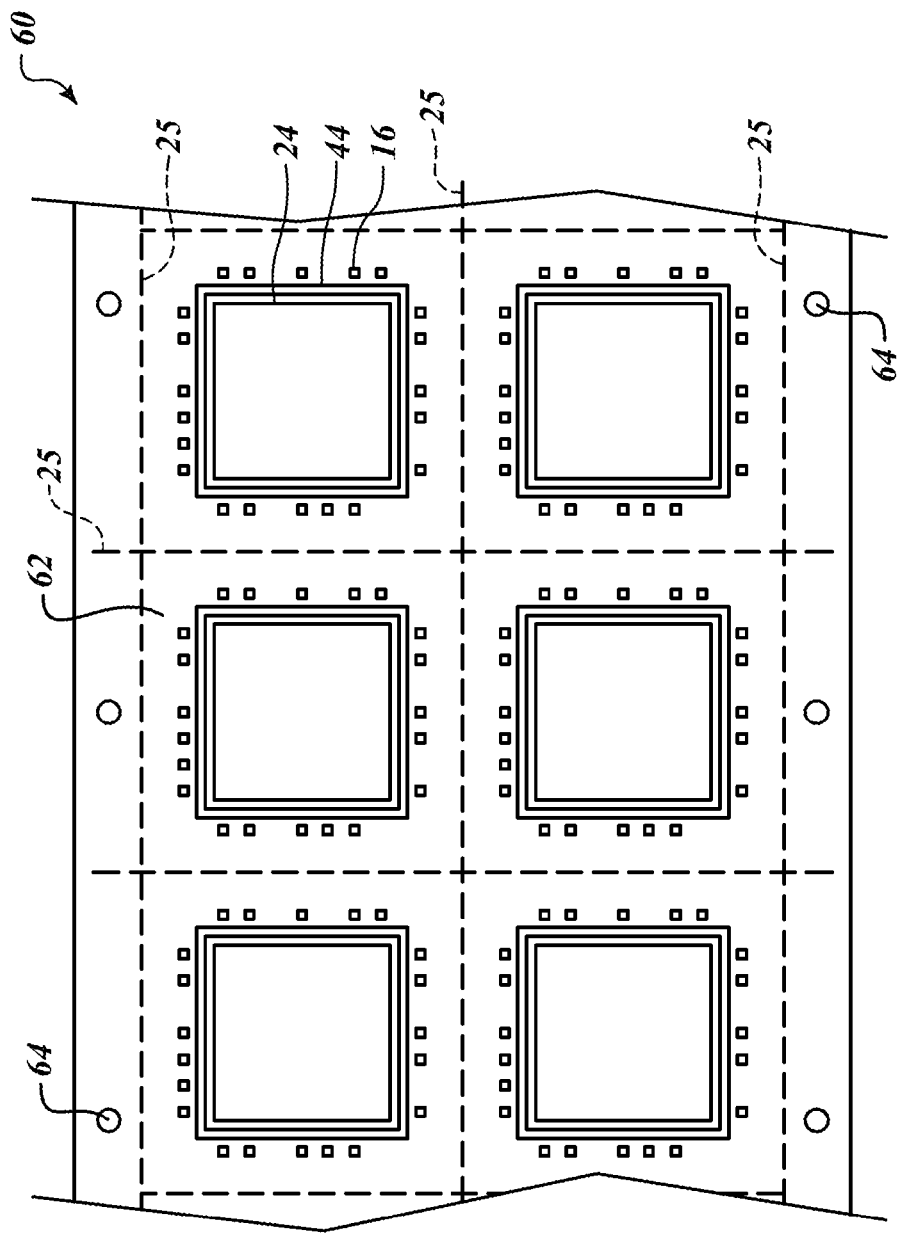
FIG. 7 is a plan view of a portion of a leadframe strip according to one embodiment.

FIG. 7 is a plan view of a portion of a leadframe strip 60 according to one embodiment. Leadframe features of a package similar to the package 40 described with reference to FIGS. 5 and 6 are shown. Also shown in dashed lines are cut lines 25 along which semiconductor packages formed on the leadframe strip 60 will eventually be cut, and which approximately define the size and shape of the finished packages. The leadframe strip 60 comprises a metal substrate 62 that is substantially continuous and unbroken, at least within the areas of the packages, as defined by the cut lines 25. This will be explained in detail hereafter. The leadframe strip 60 includes perforations 64 extending along the long edges of the strip to facilitate processing of the leadframe strip and by machinery used to make the strip and form semiconductor packages thereon.

The specific elements shown in FIG. 7 are merely exemplary. In practice, a leadframe strip according to the principles of the invention can include a wide range of features, including multiple rows of bond pads, multiple concentric contact rings, etc. Additionally, while FIG. 7 shows a leadframe strip with rows of two frames per row, the actual number of frames per row, as well as the configuration and location of perforations and fiducials for proper machine handling and processing depend on the design and size of the particular package, the size of the parent roll of material, the makes and models of the machinery that will be used to process the strip, etc.

Figure 8:
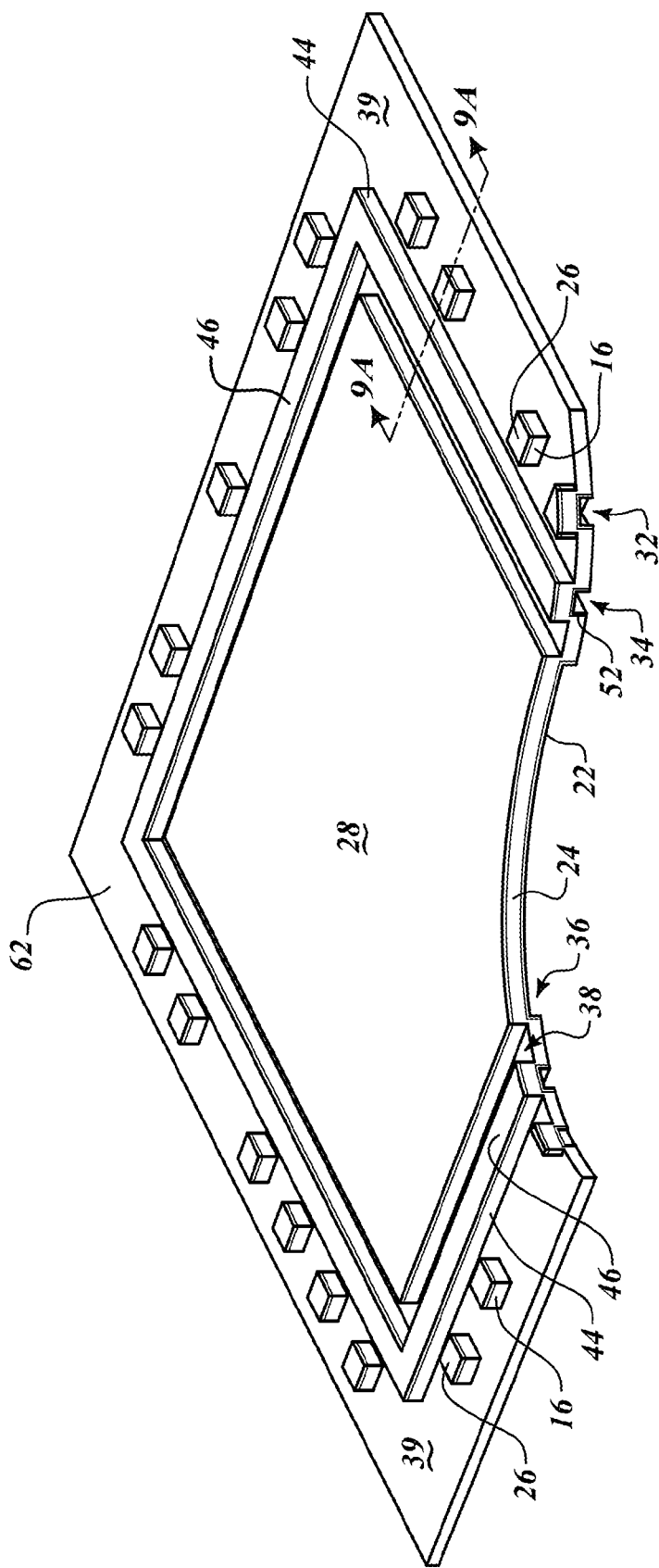
FIG. 8 is a perspective view of a portion of the leadframe strip of FIG. 7, showing the front side of the leadframe, with a smaller portion cut away to show elements of the back side.

Turning now to FIG. 8, a perspective view of a portion of the leadframe strip 60 is provided, showing the front side of the leadframe, with a smaller portion cut away to show elements of the back side of the strip. The leadframe strip 60 is preferably made from a parent roll of copper or copper alloy material. The substrate 62 is formed so that the features of the leadframe extend above the surrounding surface 39 of the substrate, i.e., away from the lower portions of the front face.

Thus, for example, a cavity, channel, or trench 38 is part of the lower face 39. The channel 38 defines a separation between the contact ring 44 and the die paddle 24. Cavities are formed on the back side of the substrate 62 in positions directly opposite the leadframe elements formed on the front side: a cavity 32 is positioned opposite each of the bond pads 16; a cavity, groove, or channel 34 is positioned opposite the contact ring 44, and a cavity 36 is positioned opposite the die paddle 24. Front surfaces of leadframe elements on the front face, including the die paddle 24, the contact ring 44, and the bond pads 16, are provided with a layer of metal plated thereon. Inside walls of the cavities 32, 34, 36 formed in the back side of the substrate are also plated.

The metal used to plate the elements of the leadframe can be any appropriate formulation, but is preferably resistant to oxidation and corrosion, in order to provide a reliable contact surface for the wirebonding process. According to one embodiment, the plating includes a layer of nickel, a layer of palladium, and a layer of gold. Total thickness of the plating will usually not exceed about 5 µm, and is preferably less than about 2 µm. Most of that thickness is made up of the nickel layer, with the layers of palladium and gold being relatively much thinner.

The metal plated in the cavities on the back side can be the same metals, or can be different metals. During the packaging process, the plated metal in the cavities will be used as an etch resist, then later during assembly of an electronic device that incorporates the completed package, the same metal will form contact surfaces for establishing electrical contact between the semiconductor die and contacts of a circuit board.

Generically, leadframe features formed in the manner described above can be referred to as lands, while the surrounding surface can be referred to as the lower face. This is not to be confused with the back side or back face of the substrate, which is on the opposite side from the lands. The lower face 39 is part of the front face of the substrate 62.

A process for manufacturing the leadframe 60, according to one embodiment, will be described in more detail with reference to FIGS. 9A-9C. Thereafter, a process for forming a semiconductor package on the leadframe, according to an embodiment, will be described with reference to FIGS. 10A-10D.

Figure 9A:
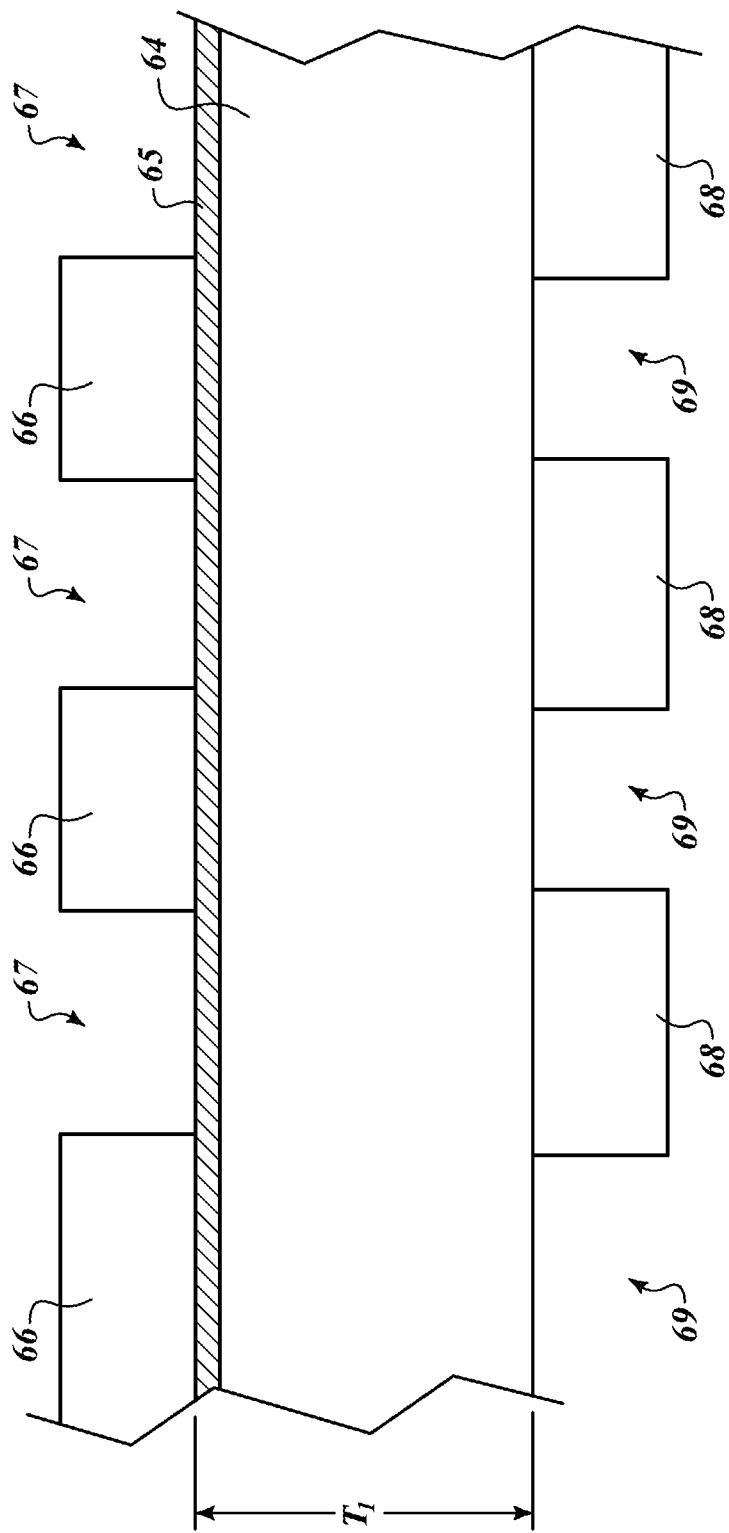
FIGS. 9A-9C are cross-sectional diagrams of the leadframe at respective stages of manufacture, according to one embodiment, as viewed from a position corresponding to the lines 9A-9A of FIG. 8.
Figure 9B:
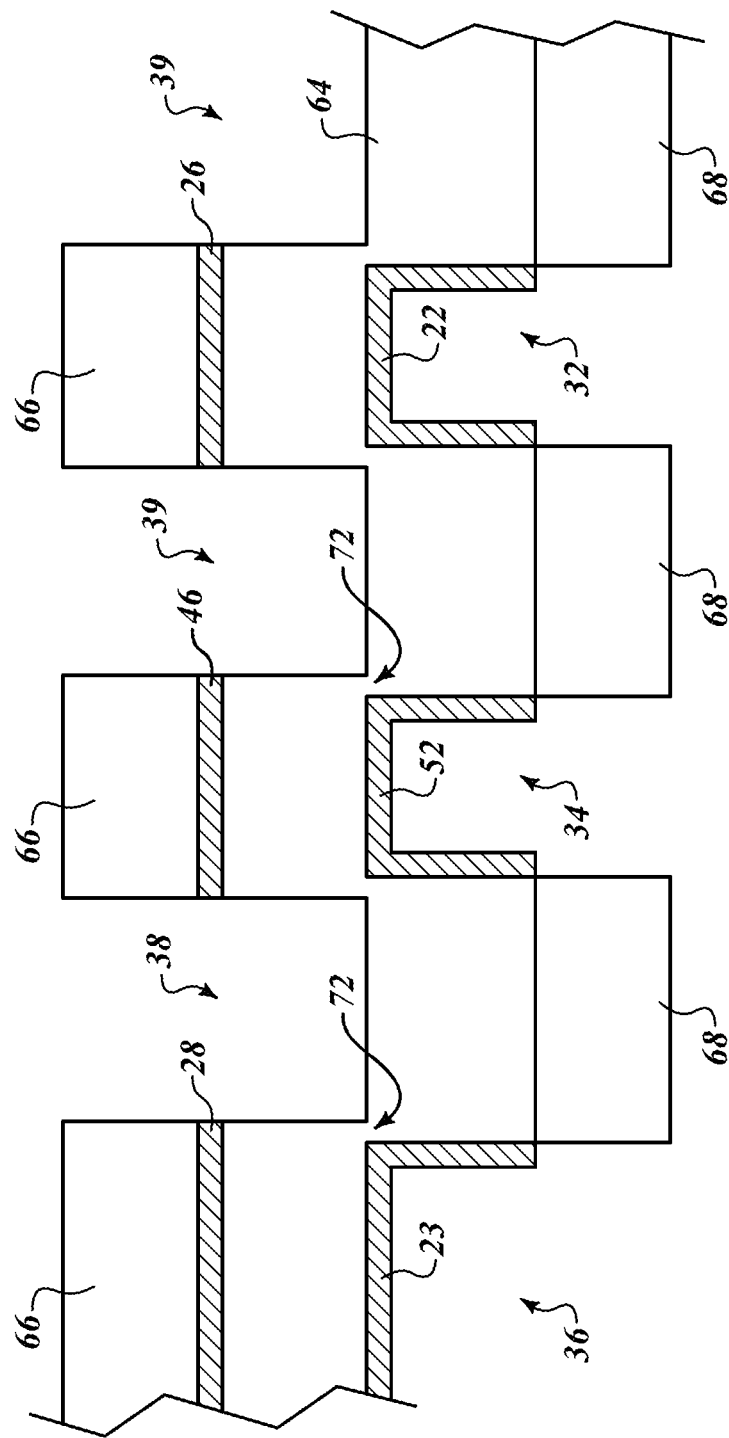
Figure 9C:
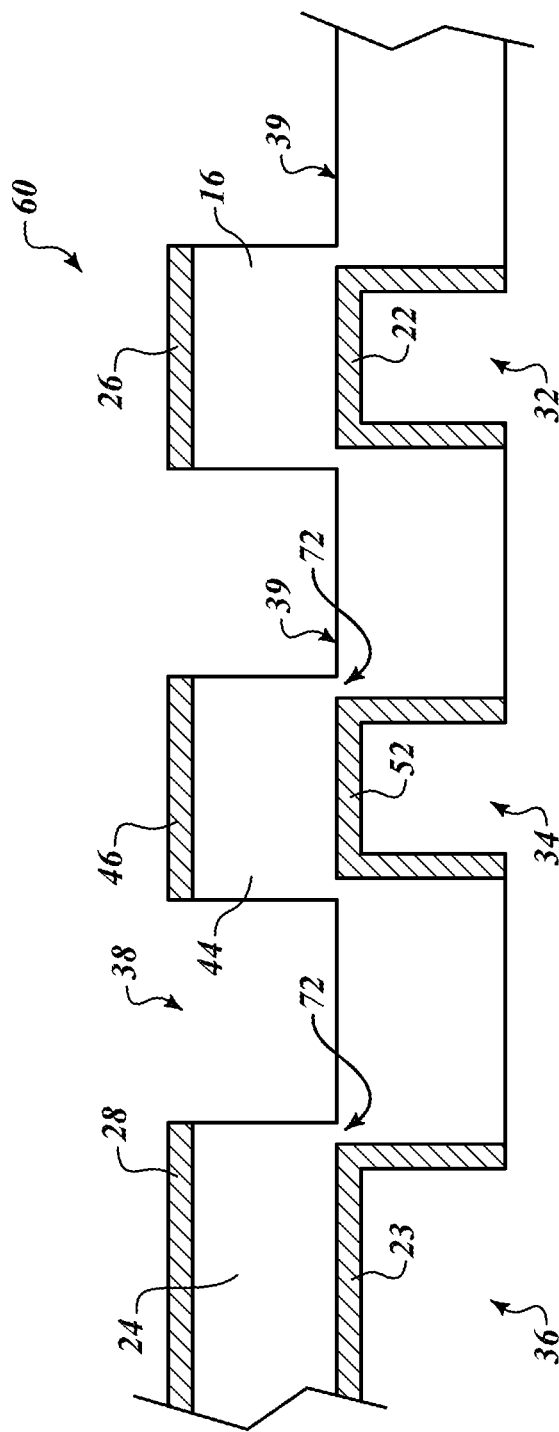

FIGS. 9A-9C are cross-sectional diagrams of a leadframe at respective stages of manufacture, according to one embodiment, as viewed from a position corresponding to the lines 9A-9A of FIG. 8. The process begins with a strip 64 of copper having a thickness T1 of about 100 µm. After cleaning to remove oxides that normally form on copper, a layer of metal 65 is plated onto a first side of the strip—hereafter the front side. A layer of etch resist 66 is then deposited over the metal layer 65 and patterned to protect the portions of the parent strip that will become lands on the front side of the leadframe. A second layer of etch resist 68 is deposited on the back side of the strip and patterned to expose the areas of the back side where the cavities are to be formed. This is the stage in the process that is shown in FIG. 9A.

As shown in FIG. 9B, the front side of the strip 64 is etched to remove the plated metal 65 that is not protected by the etch resist layer 66, then both sides are etched to remove a selected thickness of the parent strip 64 to form cavities 32, 34, and 36 on the back side, and the lower face 39, including the trench 38, on the front side. In the embodiment shown in FIG. 9B, each side is etched to a depth of about half the total thickness of the strip 64. The lateral dimensions, shape, and position of each of the cavities 32, 34, 36 on the back side are selected so as to be aligned with and slightly smaller, in all lateral dimensions, than the corresponding land on the front side of the strip. In this way, even if each side is etched to half the total thickness, a thin web of material 72 will remain between the deepest part of each cavity and any part of the front surface, so that no complete perforations are made in the substrate. A web 72 extends around the entire perimeter of and supports each feature formed on the front side of the substrate.

Following the etch step, the back side of the substrate is plated. In an electroplating operation, the material to be plated must be electrically conductive. Because the back side of the strip 64 is entirely covered by a layer of non-conductive etch resist except over the newly formed cavities 32, 34, and 36, only the inner walls of the cavities are plated in the operation. If necessary, the front side of the strip can be temporarily covered to prevent plating on that side. Finally, the etch resist layers on both sides of the strip 64 are removed from the strip, leaving the completed leadframe, shown in close detail in FIG. 9C.

While the cavities are disclosed as being slightly smaller than the corresponding feature on the opposite face of the substrate, according to an alternative embodiment, the cavities can be identical in size and shape to the corresponding feature. in such an embodiment, the etch step is controlled to be terminated before the etch process extends half the total thickness from each side. instead, the process is controlled to terminate when between about 5%-10% of the thickness remains between the etches. In this way, a supporting structure similar to the web 72 will remain between the cavities and the lower face 39. One advantage to this embodiment is that the masks used to form the resist layers 66 and 68 can be mirror images of each other, which is simpler and less expensive to produce than a mask with features that are sized differently. In some cases it may even be possible to use the same mask on both sides. Of course, it would be necessary to use a negative-acting photoresist on one side, and a positive acting resist on the other.

Figure 10C:
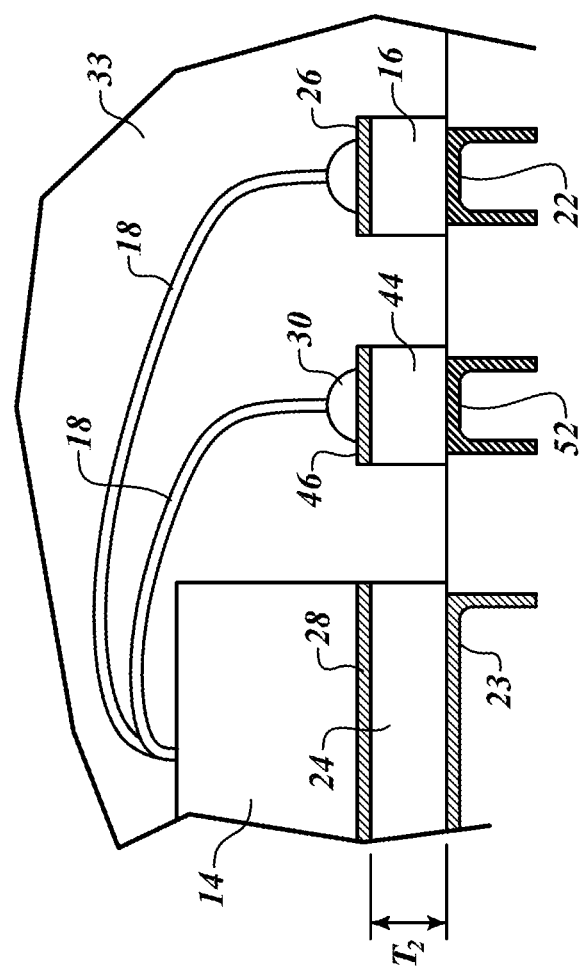
Figure 10D:
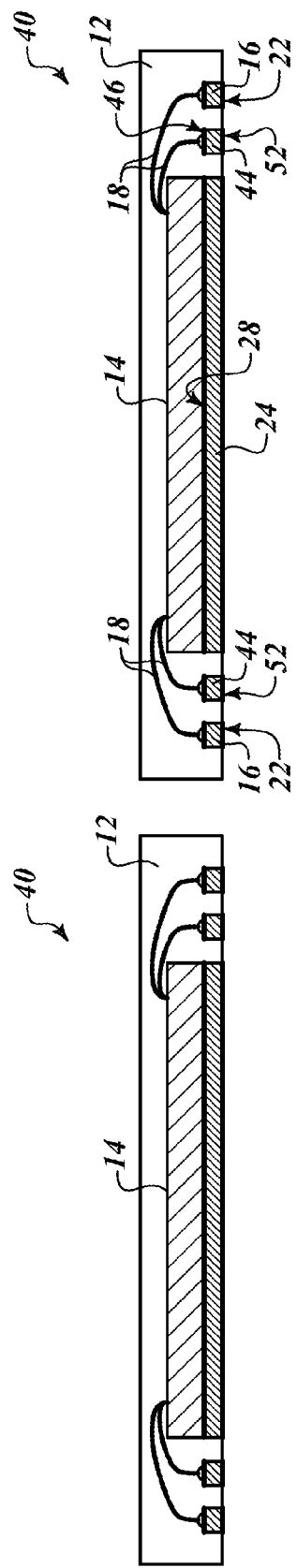

FIGS. 10A-10D are diagrams showing respective stages of the assembly of semiconductor packages according to one embodiment, using the leadframe strip 60 described with reference to FIGS. 7-9C. FIGS. 10A, 10B and 10D are cross-sectional views of an assembly of semiconductor packages 70 taken along a plane corresponding to the plane defined in FIG. 8 by lines 9A-9A, but extended through two leadframes. FIG. 10C is an enlarged view of a small portion of the assembly 70, as defined by the oval in FIG. 10B that is marked 10C.

First, as shown in FIG. 10A, semiconductor dice 14 are adhered to respective die paddles 24, and contact pads of the dice are wirebonded to the appropriate bondpads 16 or contact rings 44. These processes are very well known and understood in the art, and so will not be described in detail.

Moving to FIG. 10B, a molding compound layer 33 is then deposited over the leadframe 60 and cured, encapsulating the semiconductor dice 14 and bond wires 18. The molding compound 33 is entirely contained, on the back side, by the leadframe strip 60, so an adhesive carrier, like that described in the background is not required. Once the molding compound is cured, the back side of the leadframe strip 60 is etched to selectively remove portions thereof. Turning again briefly to FIG. 9C, an etch process that is formulated to dissolve copper, but not the metal plated into the cavities 32, 34, 36, when applied from the back side of the strip, will remove the material of the substrate that lies between the cavities, until the process reaches the lower face 39 of the front side. Bearing in mind that molding compound will have been deposited and cured on the front side, when the etch reaches the lower face, it will substantially stop, having only the narrow webs 72 against which to continue acting, and the etching process is terminated before it can have an appreciable effect on the lands of the leadframe, which are encapsulated in the molding compound 33. With the etching of the back side of the leadframe strip 60 to remove all but the small portions of the leadframes that are protected by the metal deposits, the elements of the leadframes are now electrically isolated from each other except where they are coupled by the bond wires 18.

Once the etching process is complete, the portions of the plating that were on the sidewalls of the cavities will be unsupported, as shown in the detail of FIG. 10C. Bearing in mind that in practice the layers of plated metal are only microns thick, the unsupported portions are little more than fragile burrs surrounding the contact surfaces on the back side of the package. The greatest danger is that pieces may break away and create short circuits or otherwise interfere with proper operation of the device. Accordingly, the assembly is pressure washed by as jet of high-pressure water, which quickly breaks off and removes all of the loose material, leaving the plated surfaces 22, 46, and 23 on the back side of the package.

Finally, as shown in FIG. 10D, the assembly 70 is cut into separate packages 40, which are tested and marked.

It will be recalled that in the first etch process, described with reference to FIGS. 9B and 9C, each side of the substrate is etched to a depth of about half the total thickness of the substrate. Thus, the distance from the lower face 39 to the front faces of the lands is equal to half the thickness of the original substrate, as is the depth of the cavities formed in the back side. Therefore, following the second etch step, described with reference to FIGS. 10B and 10C, half of the original thickness will have been removed. Assuming an original thickness of 100 µm, the remaining nominal thickness of the die paddle 24 and bond pads 16 is only 50 µm, which is also half of the minimum practical thickness of traditional leadframes, as explained in the background. Furthermore, by adjusting the time or chemistry of the etches performed on each side of the substrate in the first etch process, the relative depths can also be adjusted, so that the finished thickness of the leadframe is fully selectable. Even without changing the original thickness of the substrate, the finished thickness can be controlled to be anywhere from as thin as around 10 or 20 µm to as thick as about 60 or 70 µm. The upper and lower limits will in part be determined by the kinds and sizes of leadframe elements formed on the substrate.

It should be born in mind, for example, that at any given point, the substrate of the leadframe 60 of FIG. 8 is only about 50 µm in thickness. However, this is acceptable here, where a traditional leadframe of a similar thickness would be far too weak, because, first, in the disclosed embodiments there are no perforations and no separate elements that must retain position and shape while only supported by thin and often cantilevered connections to a support frame; and second, because the alternating etched regions on the opposing sides of the substrate behave like corrugations in a piece of sheet metal, which serve to stiffen the metal to a condition that is far more rigid than the same thickness of sheet metal would be if completely flat.

Figure 2:
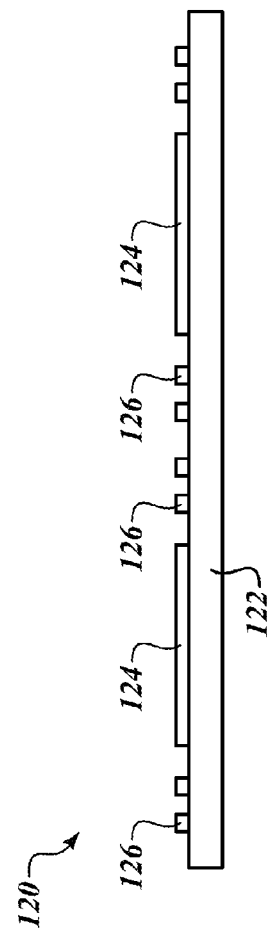
FIG. 2 is a simple diagrammatic side view of a portion of another leadframe strip according to known art.

As previously mentioned, a leadframe configured according to the principles disclosed above is not limited by the need to have all the elements coupled to a support frame. Instead, of being supported by a frame that lies in the same plane as the elements, but outside the finished dimensions of a putative package, the elements of the various embodiments are supported from structure that is much closer, lying a plane that defines a face of the intended package. One resulting distinction is that, unless there is a practical and beneficial reason, a semiconductor package formed in accordance with an embodiment will not have any portion of the original surface of the leadframe visible or exposed around its lateral perimeter. This is in contrast to most leadframe-based devises, including the one described in the background with reference to FIG. 1. While the prior art leadframe described with reference to FIG. 2 is similar to the disclosed embodiments in this respect, it suffers from a number of other deficiencies, including the cost to produce the leadframe, and also the cost and complexity to use in packaging semiconductor devices.

While a particular series of process steps has been disclosed for manufacturing a leadframe, there are many different known processes related to patterning and etching, many of which are interchangeable and can be selected, often merely on the basis of preference. Thus, an endless variety of different ways can be devised for producing, for example, the leadframe of FIG. 8, based on, for example, different orders of operation, different masking schemes, selection of resist and etch chemistries, le requirements, etc. Accordingly, the claims are not limited to any particular process or steps of a process except to the extent that the process or steps are explicitly recited, and then only in the claims in which they are recited, and claims that depend therefrom.

Additionally, while the preferred method of manufacture is by chemical machining, the substrate of a leadframe can also be stamped to form lands on the front face and corresponding cavities on the back face. The parent sheet is plated on both faces prior to being stamped, and the back side is also coated with an etch resist. The back side is subjected to a brief abrasion after stamping, which removes the plating and resist on the back surface, without removing them from the cavities. After the molding compound is deposited and cured, and the back of the leadframe is etched, the process will proceed as described above, except that the plating on the front face will remain. It is then necessary to perform another etch to remove the plating, while the plating in the cavities will be largely protected by the etch resist remaining in the cavities, although the burrs extending around the sidewalls of the cavities will be removed as well, eliminating the need for the pressure washing step. Following the etch process, the etch resist is removed using the appropriate solvents.

As used in the specification and claims, the term front is used to refer to the side of a leadframe that would face away from a circuit board if the leadframe were in a package mounted to the circuit board according to its design. Conversely, back is used to refer to the side or face opposite the front side and facing the circuit board. Use of front and back with reference to other related elements are to be construed accordingly.

The term land is used to refer to the features of a leadframe that extend above the surrounding surface on the front face, and the term lower face is used to refer to a part of the front face of a leadframe that extends around the lands but lies closer to the back face.

The term lateral is used to refer to directions or dimensions extending in a plane that lies substantially parallel to the front and back faces of a leadframe.

The term coupled, as used in the claims, includes within its scope indirect coupling, such as when two elements are coupled with one or more intervening elements even where no intervening elements are recited. For example, where a claim recites a fluid output of a first heat exchanger coupled to a fluid input of a second heat exchanger, this language also reads on embodiments in which fluid passes from a first heat exchanger through a turbine before entering a second heat exchanger.

The term over is used in the specification and claims to refer to the relative positions of two or more elements with respect to a third element, although the third element may be implied by the context. The term on is used to refer to a physical relationship between two elements. Neither term should be construed as requiring direct physical contact between the elements, nor should they be construed as indicating any particular orientation, either absolute, or with respect to the third element. So, for example, if a claim recites a second layer positioned over a first layer on a substrate, this phrase indicates that the second layer is coupled to the substrate and that the first layer is between the second layer and the substrate. It does not indicate that the layers are necessarily in direct physical contact with each other or with the substrate, but may instead have one or more intervening layers or structures. It also does not indicate that the substrate is oriented in a manner that places the second layer physically above the first layer, nor that, for example, the layers are positioned over a front face of the substrate, as that term is used herein.

In describing the embodiments illustrated in the drawings, directional references, such as right, left, top, bottom, etc., are used to refer to elements or movements as they are shown in the figures. Such terms are used to simplify the description and are not to be construed as limiting the claims in any way.

The unit symbol "µm" is used herein to refer to a value in microns. One micron is equal to $1\times10^{-6}$ meters.

Ordinal numbers, e.g., first, second, third, etc., are used according to conventional practice, i.e., for the purpose of clearly distinguishing between claimed elements or features thereof. The use of such numbers does not suggest any other relationship, e.g., order of operation or relative position of such elements, nor does it exclude the possible combination of the listed elements into a single, multiple-function, structure or housing. Furthermore, ordinal numbers used in the claims have no specific correspondence to those used in the specification to refer to elements of disclosed embodiments on which those claims read.

Where a claim limitation recites a structure as an object of the limitation, that structure itself is not an element of the claim, but is a modifier of the subject. For example, in a limitation that recites "a leadframe having a die paddle configured to receive a semiconductor die," the semiconductor die is not an element of the claim, but instead serves to define the scope of the term die paddle. Additionally, subsequent limitations in the same claim or dependent claims that recite or characterize additional elements relative to the semiconductor die do not render the die an element of that claim.

The abstract of the present disclosure is provided as a brief outline of some of the principles of the invention according to one embodiment, and is not intended as a complete or definitive description of any embodiment thereof, nor should it be relied upon to define terms used in the specification or claims. The abstract does not limit the scope of the claims.

U.S. patent application Ser. No. 12/982,841, filed concurrently herewith and by the same inventors, which is now patented as U.S. Pat. No. 8,426,254, is directed to subject matter that is related to or has some technical overlap with the subject matter of the present disclosure, and is incorporated herein in its entirety.

Elements of the various embodiments described above can be combined, and further modifications can be made, to provide further embodiments without deviating from the spirit and scope of the invention. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification, but should be construed to include all possible embodiments along with the full scope of equivalents to which such claims are entitled. Accordingly, the claims are not limited by the disclosure.

The invention claimed is:

1. A method, comprising:
    etching a first depth into a first face of a conductive substrate to form a plurality of first cavities, the first depth being less than an initial thickness of the conductive substrate;
    etching a plurality of second cavities a second depth into a second face of the conductive substrate, each of the plurality of second cavities being offset from the first cavities such that webs are formed between adjacent first and second cavities, the second depth being less than the initial thickness of the conductive substrate;
    fixing semiconductor dice to the first face of the conductive substrate between two adjacent first cavities, respectively;
    electrically coupling each of the semiconductor die to bond pads on the first face of the conductive substrate;
    forming a molding compound layer over the first face of the conductive substrate that covers the plurality of semiconductor dice; and
    etching the second face of the conductive substrate between the plurality of second cavities and exposing the molding compound layer.

2. The method of claim 1, wherein etching the second face of the conductive substrate comprises electrically isolating the semiconductor dice from the bond pads.

3. The method of claim 1, further comprising plating a layer of metal over the first face of the conductive substrate.

4. The method of claim 3, further comprising defining lateral dimensions of each of the plurality of bond pads by patterning the layer of metal.

5. The method of claim 1, comprising plating a layer of metal on an inner surface of each of the plurality of second cavities.

6. The method of claim 5, wherein etching the second face of the conductive substrate between the plurality of second cavities comprises exposing a surface of the layer of metal.

7. A method, comprising:
    forming first cavities on a first surface of a leadframe and thereby forming a first raised surface and a plurality of second raised surfaces;
    forming second cavities on a second surface of the leadframe, the second cavities on the second surface being below the first raised surface and the plurality of second raised surfaces and not below the first cavities on the first surface;
    fixing a semiconductor die to the first raised surface of the first surface of the leadframe;
    placing contact pads of the semiconductor die in electrical contact with the plurality of second raised surfaces, respectively, of the first surface of the leadframe;
    forming a molding compound layer over the semiconductor die on the first surface of the leadframe; and
    at the second surface, removing the leadframe between the second cavities to expose the molding compound layer.

8. The method of claim 7, wherein the removing comprises etching the second surface of the leadframe.

9. The method of claim 7, further comprising depositing a metallic layer in the second cavities prior to removing the leadframe between the second cavities.

10. The method of claim 9, wherein depositing the metallic layer comprises depositing the metallic layer along a bottom surface and sidewalls of the second cavities.

11. The method of claim 10, wherein removing the leadframe between the second cavities comprises removing the leadframe between the sidewalls of the second cavities to expose a surface of the metallic layer.

12. The method of claim 11, further comprising removing the sidewalls of the second cavities.

13. The method of claim 12, wherein removing the sidewalls of the second cavities comprising removing the sidewalls in a pressure wash step.

14. The method of claim 7, wherein the affixing comprises affixing the semiconductor die to a die paddle, the die paddle being located between respective first cavities on the first surface of the leadframe.

15. The method of claim 7, wherein forming the first cavities and the second cavities comprises using stamping tool to form the first and second cavities.

16. The method of claim 7, wherein forming the first cavities comprises etching the first surface of the leadframe, and forming the second cavities comprises etching the second surface of the leadframe.

17. The method of claim 7, further comprising dicing the leadframe to form a plurality of individual packages.

18. A method, comprising:
etching a first depth into a first face of a conductive substrate to form a plurality of first cavities, the first depth being less than an initial thickness of the conductive substrate;
etching a plurality of second cavities a second depth into a second face of the conductive substrate, each of the plurality of second cavities being offset from the first cavities and not overlapping the first cavities, the second depth being less than the initial thickness of the conductive substrate;
fixing semiconductor dice to the first face of the conductive substrate between two adjacent first cavities, respectively;
electrically coupling each of the semiconductor die to bond pads on the first face of the conductive substrate;
forming a molding compound layer over the first face of the conductive substrate that covers the plurality of semiconductor dice; and
etching the second face of the conductive substrate between the plurality of second cavities and exposing the molding compound layer.

19. The method of claim 18, wherein etching the second face of the conductive substrate comprises electrically isolating the semiconductor dice from the bond pads.

20. The method of claim 18, etching the second face of the conductive substrate between the plurality of second cavities causes a portion of the conductive substrate to remain exposed.

* * * * *